(12) United States Patent
Boufnichel

(10) Patent No.: US 11,380,486 B2
(45) Date of Patent: Jul. 5, 2022

(54) CAPACITOR

(71) Applicant: STMicroelectronics (Tours) SAS, Tours (FR)

(72) Inventor: Mohamed Boufnichel, Monnaie (FR)

(73) Assignee: STMicroelectronics (Tours) SAS, Tours (FR)

( * ) Notice: Subject to any disclaimer, the term of this patent is extended or adjusted under 35 U.S.C. 154(b) by 373 days.

(21) Appl. No.: 16/571,738

(22) Filed: Sep. 16, 2019

(65) Prior Publication Data

US 2020/0098524 A1 Mar. 26, 2020

(30) Foreign Application Priority Data

Sep. 21, 2018 (FR) ...................................... 1858585

(51) Int. Cl.
| | |
|---|---|
| *H01L 49/02* | (2006.01) |
| *H01G 4/33* | (2006.01) |
| *H01G 4/30* | (2006.01) |
| *H01G 4/224* | (2006.01) |

(52) U.S. Cl.
CPC ............... *H01G 4/30* (2013.01); *H01G 4/224* (2013.01); *H01G 4/33* (2013.01); *H01L 28/91* (2013.01)

(58) Field of Classification Search
CPC .......... H01G 4/005; H01G 4/012; H01G 4/06; H01G 4/224; H01G 4/30; H01G 4/33; H01G 4/385; H01L 28/40; H01L 28/91
See application file for complete search history.

(56) References Cited

U.S. PATENT DOCUMENTS

| | | | |
|---|---|---|---|
| 2006/0014385 A1* | 1/2006 | Kim | ................... C23C 16/45529 438/680 |
| 2006/0292810 A1* | 12/2006 | Seo | ................... H01L 27/10852 438/381 |
| 2008/0186648 A1 | 8/2008 | Choi et al. | |
| 2009/0079029 A1 | 3/2009 | Chen | |
| 2011/0073990 A1* | 3/2011 | Berger | ................... H01G 4/005 257/532 |
| 2015/0076657 A1 | 3/2015 | Chou et al. | |
| 2015/0206662 A1* | 7/2015 | Lamy | ....................... H01G 4/38 174/260 |
| 2016/0204110 A1* | 7/2016 | Baskaran | ................ H01L 28/20 257/301 |
| 2020/0098524 A1 | 3/2020 | Boufnichel | |

FOREIGN PATENT DOCUMENTS

| | | |
|---|---|---|
| CN | 1567072 A | 1/2005 |
| CN | 104465521 A | 3/2015 |
| CN | 107689362 A | 2/2018 |
| CN | 210778270 U | 6/2020 |
| WO | 2015/047233 A1 | 4/2015 |

* cited by examiner

*Primary Examiner* — Nathan Milakovich
(74) *Attorney, Agent, or Firm* — Seed IP Law Group LLP

(57) ABSTRACT

A vertical capacitor includes a stack of layers conformally covering walls of a first material. The walls extend from a substrate made of a second material different from the first material.

20 Claims, 6 Drawing Sheets

CAPACITOR

CROSS-REFERENCE TO RELATED APPLICATION

This application claims the priority benefit of French Patent application No. 18/58585, filed on Sep. 21, 2018, the content of which is hereby incorporated by reference in its entirety to the maximum extent allowable by law.

BACKGROUND

Technical Field

The present disclosure generally concerns electronic components, and more particularly capacitors.

Description of the Related Art

Capacitors are components which are present in electronic circuits. Capacitors are electronic components, generally comprising two electrodes separated by an insulating layer.

In the context of the miniaturization of electronic components, it is currently desired to increase the capacitance obtained for a given substrate surface area.

BRIEF SUMMARY

Embodiments of the present disclosure provide a vertical capacitor comprising a stack of layers conformally covering at least walls of a first material, the walls extending from a substrate made of a second material different from the first one.

According to an embodiment, the stack of layers further extends over the substrate between the walls.

According to an embodiment, the first material is silicon oxide.

According to an embodiment, the stack comprises an alternation of insulating layers and of conductive layers, the lower and upper layers of the stack being conductive layers.

According to an embodiment, each wall forms, in top view, the contour of a geometric shape.

According to an embodiment, the stack extends inside and outside of the contours of the geometric shapes.

According to an embodiment, the substrate within the contour is covered with a layer made of the first material.

According to an embodiment, the stack extends over two opposite sides of at least a portion of the walls.

According to an embodiment, the smallest dimension of each wall is smaller than 150 nm.

According to an embodiment, the second material is a material capable of being oxidized.

Another embodiment provides a method of manufacturing a capacitor comprising a step of forming walls, a stack of layers extending over lateral walls and an upper surface of the walls and between the walls, the walls being made of a first material, the walls extending from a substrate made of a second material, the first and second materials being different.

According to an embodiment, the method comprises a step of forming cavities in the substrate.

According to an embodiment, the method comprises a step of forming walls wherein an insulating layer is formed on the sidewalls and the bottoms of each cavity.

According to an embodiment, the insulating layers are formed by oxidation on the substrate.

According to an embodiment, the method comprises a step of etching the substrate portions located between the cavities.

The foregoing and other features and advantages will be discussed in detail in the following non-limiting description of specific embodiments in connection with the accompanying drawings.

DETAILED DESCRIPTION

Figure 1A:
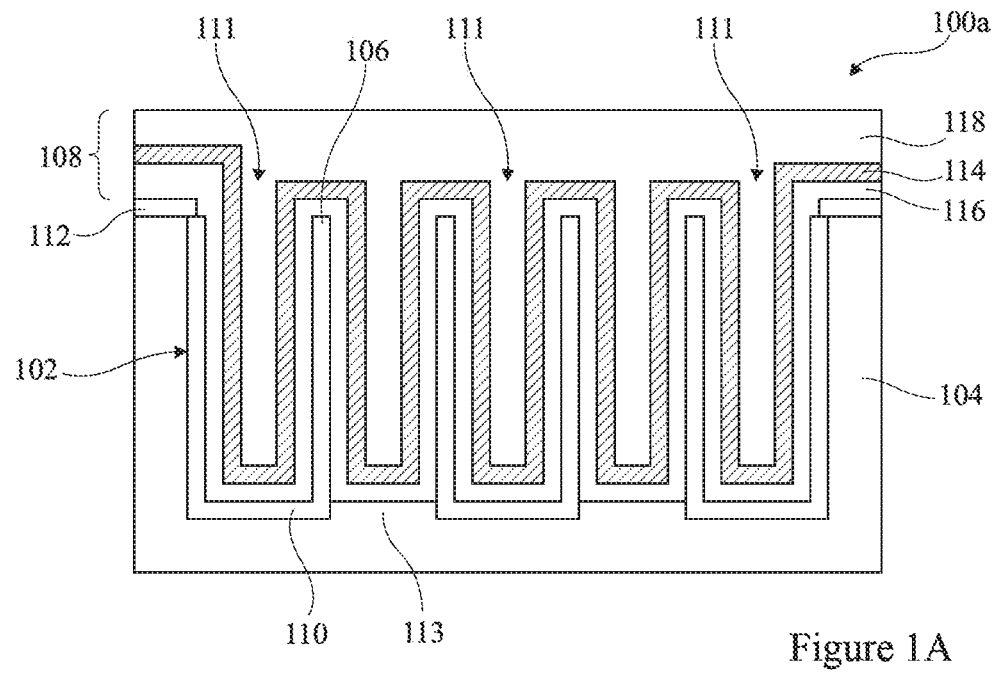
FIGS. 1A and 1B schematically and partially shows two capacitors according to embodiments of the present disclosure.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements. Unless indicated otherwise, when the term "coupled" is used, the connection can be implemented by a direct connection.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "approximately", "substantially", and "in the order of" are used herein to designate a tolerance of plus or minus 10%, preferably of plus or minus 5%, of the value in question.

Figure 1B:
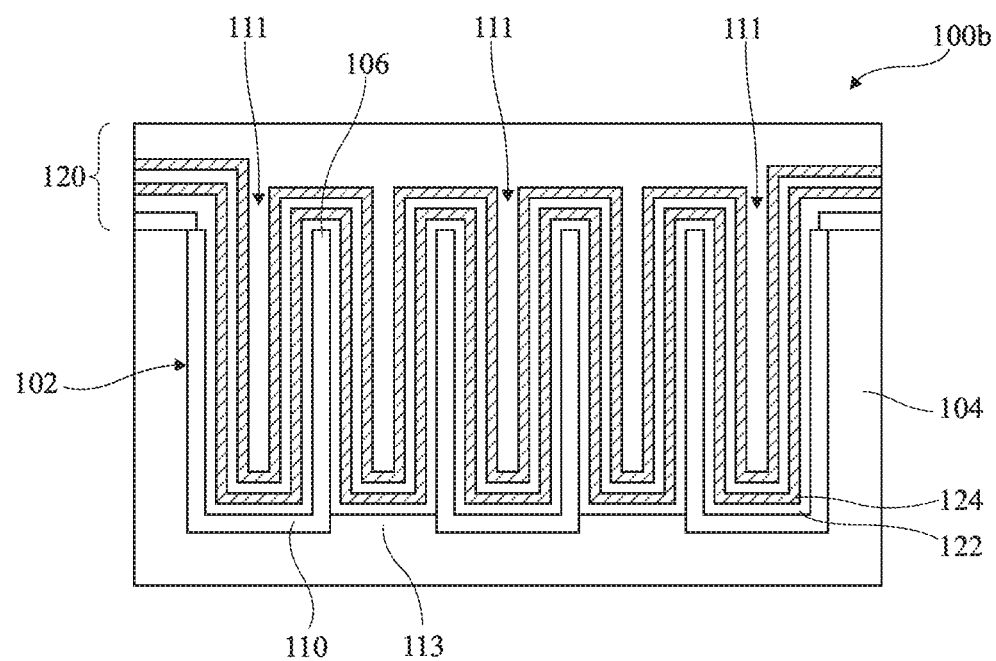

FIGS. 1A and 1B comprise two cross-sectional views schematically and partially showing two embodiments of a capacitor 100a or 100b, for example, located in a cavity 102 of a substrate 104.

Capacitors 100a and 100b are vertical capacitors, that is, capacitors comprising a stack of layers at least partially extending in a substantially vertical direction. Substantially vertical direction means a direction forming an angle of less than 45° with the vertical direction.

FIG. 1A illustrates a capacitor 100a. Walls 106 are located in cavity 102 and extend from the bottom of cavity 102. Walls 106 for example reach the opening of cavity 102. Walls 106 form the contour of geometric shapes, examples of which will be described in relation with FIGS. 2A-2C. The contours formed by the walls are preferably closed contours. The regions of the bottom of cavity 102 located within the contours of each wall 106 are preferably covered with a portion 110 of the material of wall 106. Thus, each wall 106 and the corresponding portion 110 form a compartment 111 comprising a bottom and lateral walls.

Regions 113 of substrate 104 located between compartments 111 are preferably not covered with an insulating layer.

A portion of certain walls 106 may be in contact with the walls of cavity 102. Further, a stack of layers 108, for example, made of an insulating material, for example, of the same material as walls 106, are located on the upper surface of substrate 104 around cavity 102.

Walls 106 preferably have a thickness smaller than 150 nm, for example, smaller than 100 nm, for example, smaller than 50 nm. Preferably, the upper surface of each portion 110 is coplanar with the bottom of cavity 102 outside of the contours formed by walls 106.

The stack of layers 108, which may be referred to as stack 108 in the following description, forming capacitor 100a, is deposited on top of and between walls 106. More specifically, stack 108 comprises layers extending continuously in compartments 111, covering the sides of walls 106 and portions 110, and between compartments 111, covering the upper surfaces and the outer sides of walls 106 and the portions of substrate 104 located between compartments 111.

Stack 108, forming capacitor 100a, comprises an insulating layer 114 (hatched in FIG. 1) between two conductive layers 116 and 118 forming electrodes. Conductive layer 116 is the lower layer of stack 108 and conformally extends on top of and between walls 106. Insulating layer 114 conformally extends on layer 116. Layer 118 is laid on insulating layer 116. The upper surface of layer 118 is preferably substantially planar and located above cavity 102.

The stack may further extend out of cavity 102. More specifically, the stack may extend over at least a portion of layers 112, out of cavity 102. Contacts with conductive layers 116 and 118, not shown, are for example located outside of cavity 102.

FIG. 1B illustrates a capacitor 100b, comprising a plurality of capacitors connected in parallel. FIG. 1B is similar to FIG. 1A except for the stack of layers 108, which is replaced with a stack of layers 120. Stack 120 comprises an alternation of conductive layers 122 and of insulating layers 124 (hatched in FIG. 1). Stack 120 shown in FIG. 1B comprises three conductive layers 122 and two insulating layers 124. Stack 120 may however comprise any number of insulating layers 124, each located between two conductive layers 122. The lower layer of stack 120, that is, the layer in contact with walls 106 and substrate 104 between compartments 111, is a conductive layer 122. The upper layer of stack 120 is a conductive layer 122. The upper surface of the upper layer of stack 120 is preferably substantially planar.

Contacts with each of conductive layers 122, not shown, are for example located outside of cavity 102.

Figure 2A:
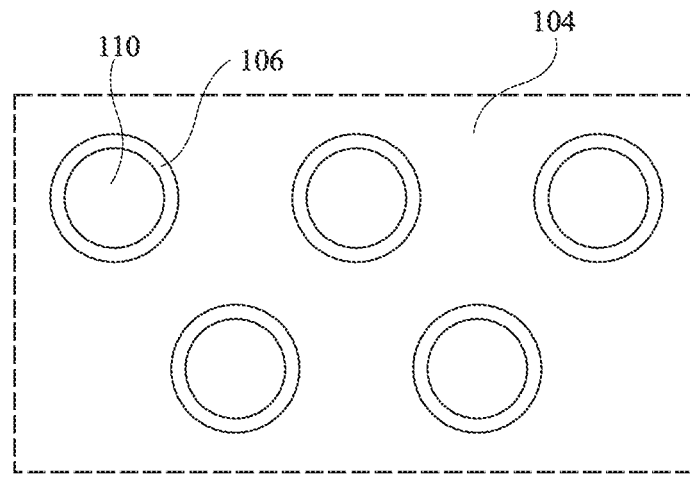
FIGS. 2A-2C show, in top views, examples of portions of the structures of FIGS. 1A and 1B.
Figure 2B:
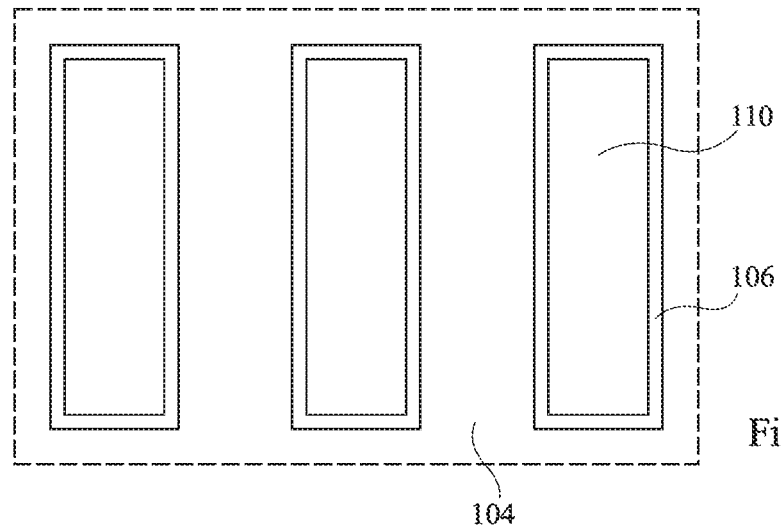
Figure 2C:
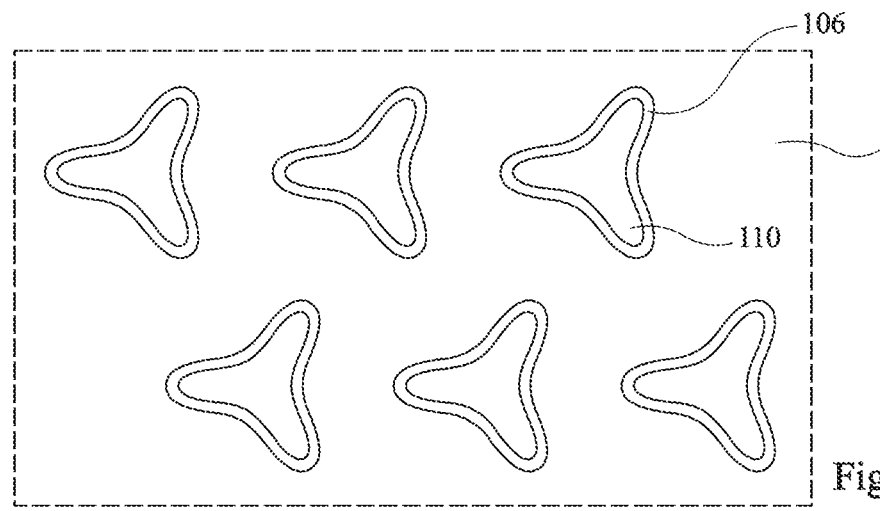

FIGS. 2A-2c show, in top views, examples of portions of the embodiments of FIGS. 1A and 1B. More particularly, FIGS. 2A-2c show, in top views, three examples of structures on which capacitors 100a and 100b may be formed. Thus, the views of structures FIG. 2A-2C correspond to views of cavity 102 without stacks 108 or 120.

The contour, preferably closed, formed by each wall 106 may be substantially that of any shape, for example, of a circle (FIG. 2A), of a rectangle (FIG. 2B, of a tripod (FIG. 2C), of an oval, etc.

Figure 3A:
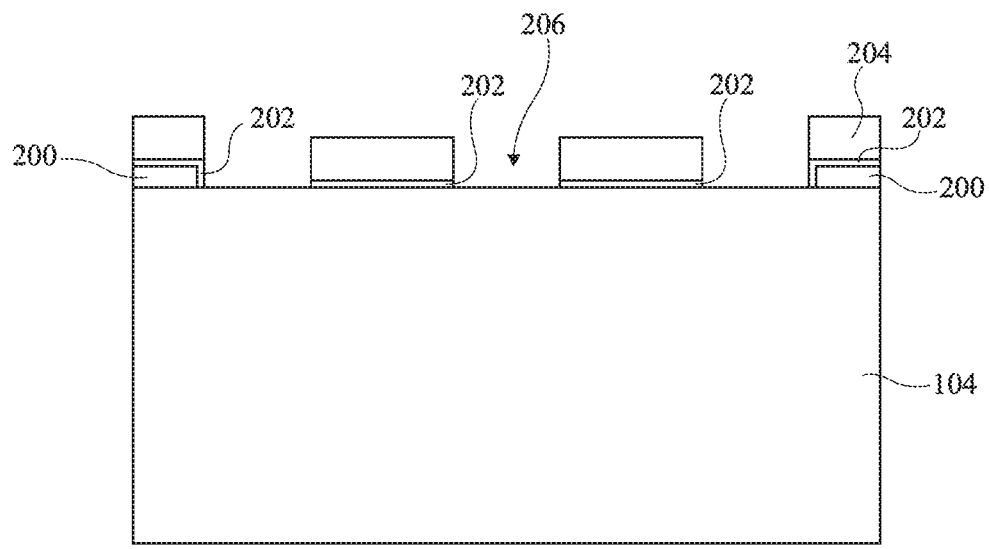
FIGS. 3A and 3B schematically and partially show two structures resulting from steps of an embodiment of a capacitor manufacturing method according to the present disclosure.
Figure 3B:
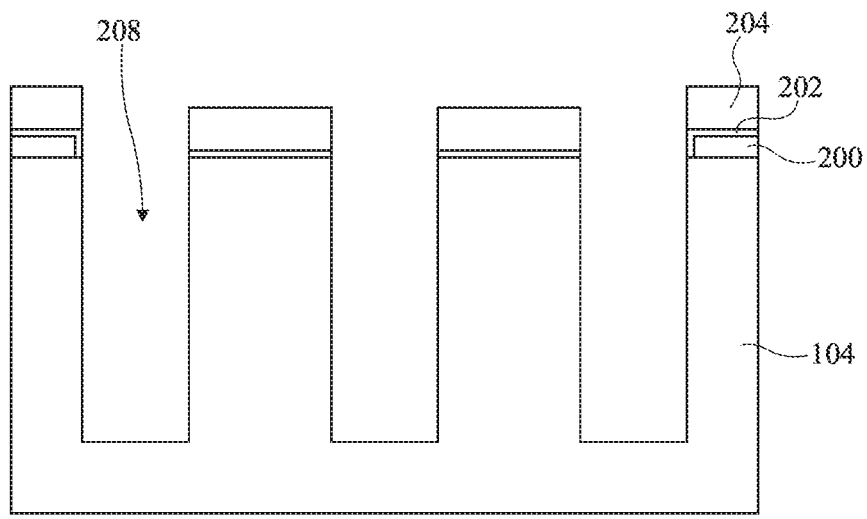

FIGS. 3A and 3B schematically and partially show two structures resulting from steps of an embodiment of a capacitor manufacturing method according to the present disclosure.

FIG. 3A results from a step of forming a layer 200, for example, made of an insulating material, for example, of silicon oxide, on substrate 104. Substrate 104 is preferably made of a material which can be oxidized, for example, of silicon.

Layer 200 comprises an opening at the location where cavity 102 is desired to be formed, that is, at the location of the capacitor which is desired to be formed.

A layer 202 is then formed on layer 200 and on substrate 104 in the opening of layer 200. In particular, layer 202 covers the sidewalls of layer 200, that is, the walls of the opening. Layer 202 is covered with a layer 204. Layer 204 is preferably made of an insulating material, preferably of the same material as layer 200, for example, of silicon oxide. Layer 202 is made of a material which can be selectively etched over the material of layer 204 and which cannot be oxidized, for example, silicon nitride. Openings are then formed in layers 202 and 204 at the locations of the compartments formed by walls 106. More particularly, openings 206 in layer 202 have the shape of the geometric shapes having their contour defined by walls 106.

Preferably, the openings in layers 202 and 204 are formed to keep portions of layer 202 on the sidewalls of layer 200. Thus, layer 200 is fully protected by layer 202.

FIG. 3B results from an etch step during which the substrate is etched through openings 206 to form cavities 208.

The openings of cavities for example have critical dimensions in the range from approximately 0.5 µm to approximately 1 µm and a depth in the range from 35 to 45 µm.

Figure 4A:
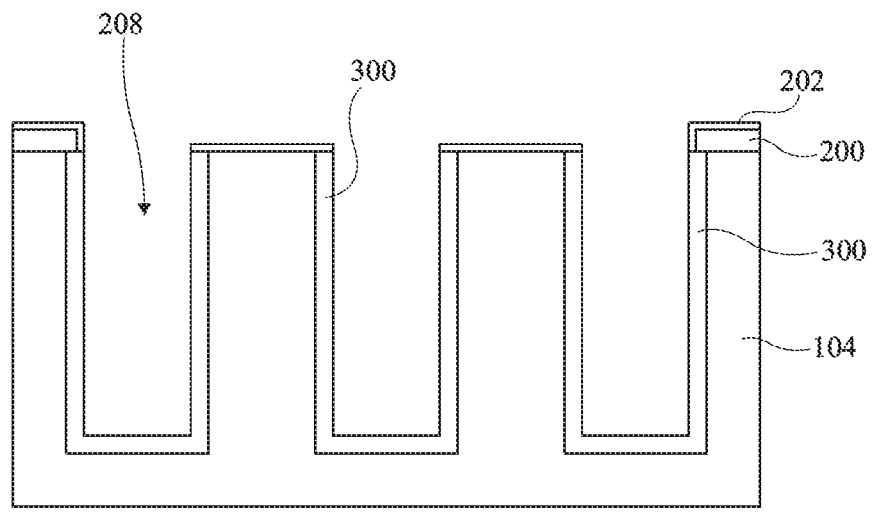
FIGS. 4A and 4B partially and schematically show two structures resulting from other steps of an embodiment of a capacitor manufacturing method.
Figure 4B:
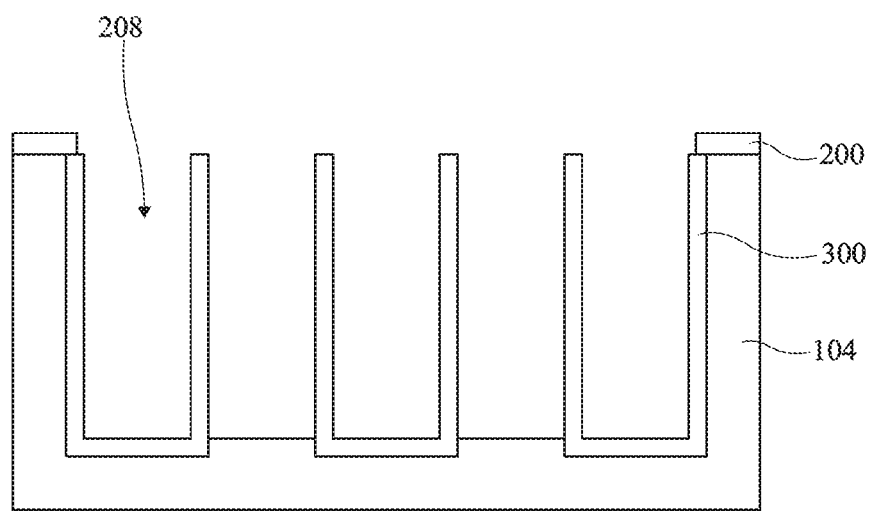

FIGS. 4A and 4B schematically and partially show two structures resulting from other steps of an embodiment of a capacitor manufacturing method.

FIG. 4A results from a step during which layer 204 is removed and during which an insulating layer 300 is formed on the sidewalls and the bottom of each cavity 208. Layers 300 are for example formed by oxidizing the material of substrate 104 at the level of the sidewalls and of the bottom of cavities 208. Each layer 300 comprises a first portion located on the bottom of the cavity, and second portions extending on the sidewalls of the cavity, between the bottom of the cavity and its opening. The second portions will form walls 106 and the first portions form portions 110.

The thickness of layer 300, and thus of walls 106, is preferably smaller than 150 nm, for example, smaller than 100 nm, for example, smaller than 50 nm.

FIG. 4B is obtained after a step of removing layer 202 and a step of etching substrate 104 located between the second portions of layers 300. The etching of the substrate is for example maintained until the same level as the upper surface of the bottom of cavities 208 is reached.

The method of etching substrate 104 is selected to avoid etching the material of layers 300 and 200. Layers 200 thus enable protection of the portions of substrate 104 which are not desired to be etched.

Figure 5:
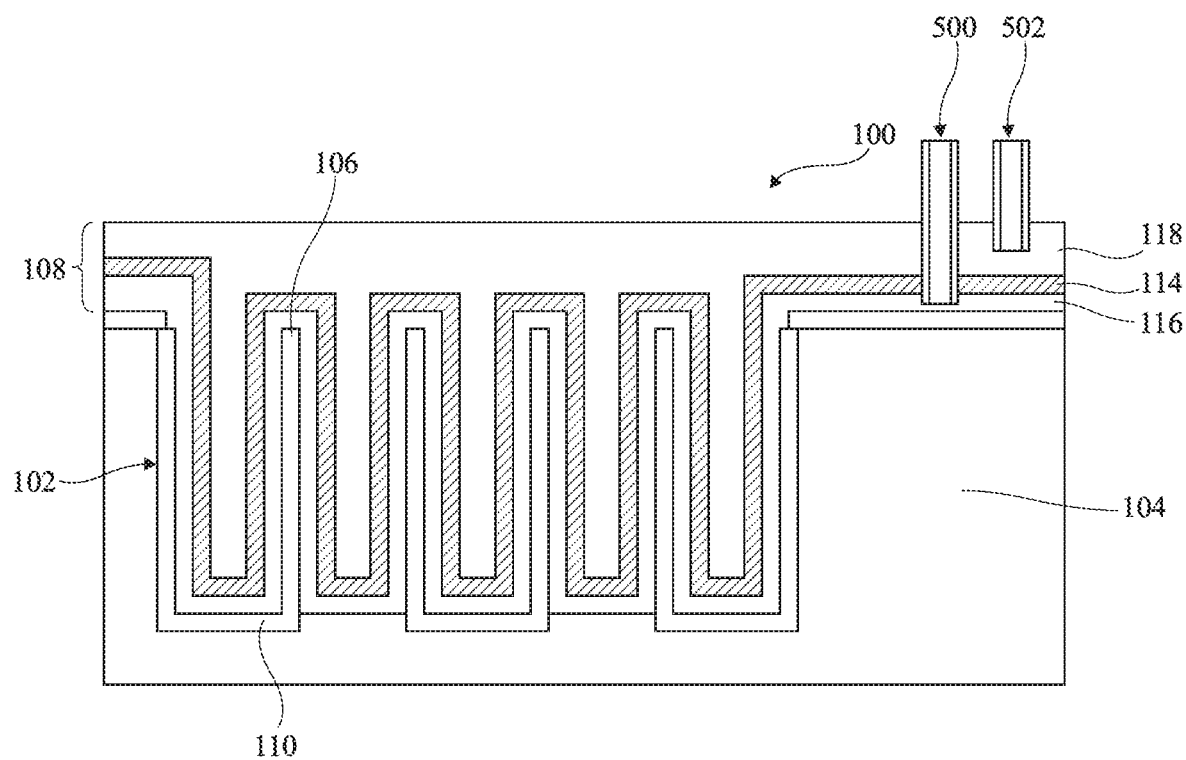
FIG. 5 schematically and partially shows a structure resulting from a step of an embodiment of a capacitor manufacturing method.

FIG. 5 schematically and partially shows a structure resulting from another step of a capacitor manufacturing method according to an embodiment of the present disclosure.

During this step, the stack of layers 108 or 120 forming the capacitor is formed. The stack shown in FIG. 5 is stack 108, comprising an insulating layer 114 between two conductive layers 116 and 118.

The contacts with the different conductive layers are then formed. These are for example insulated vias 500 and 502, comprising a conductive core surrounded with an insulating sheath. Insulated via 502 allows the electric connection with conductive layer 118. Insulated via 500 crosses conductive layer 118 and insulating layer 114 and allows the electric connection with conductive layer 116.

An advantage of the described embodiments is that they enable increasing the capacitance of a capacitor on a given substrate surface area.

Capacitors could have been formed by etching cavities into the substrate and by forming the stack of layers forming the capacitor in the cavities and on the substrate portions (non-etched) located between the cavities, such substrate portions then having a use similar to that of walls 106. However, current etch methods, for example, photolithography methods, do not enable forming deep and narrow cavities, that is for example having a depth higher than 20 µm, for example equal to 40 µm, and having for example horizontal dimensions lower than 1 µm, separated by thin substrate portions having, for example, a thickness smaller than 1 µm.

The capacitance of a capacitor comprising an insulating layer between two conductive layers is defined by the following equation:

$$C = \frac{\varepsilon_r \varepsilon_0 A}{d}$$

where d is the thickness of the insulating layer, A is the area of the interface between the insulating layer and one of the conductive layers, $\varepsilon_0$ is the permittivity of vacuum and $\varepsilon_r$ is the relative permittivity of the material of the insulating layer.

Thus, the decrease of the wall thickness enables increasing area A for a given substrate surface area and thus the capacitance of the capacitor.

It is possible to modify different criteria to obtain capacitors adapted to the various possible applications. It is thus for example possible to modify:
  the depth of cavities 102, and thus of cavities 208;
  the number of layers in stack 108 or 120, and thus the number of capacitors in parallel;
  the number of cavities 208; and
  the dimensions of the openings of cavities 208.

For example, for a given substrate surface area, it is possible to decrease the capacitor depth while keeping substantially the same capacitance value as in the case where the cavities are separated by walls formed from substrate 104.

Figure 6:
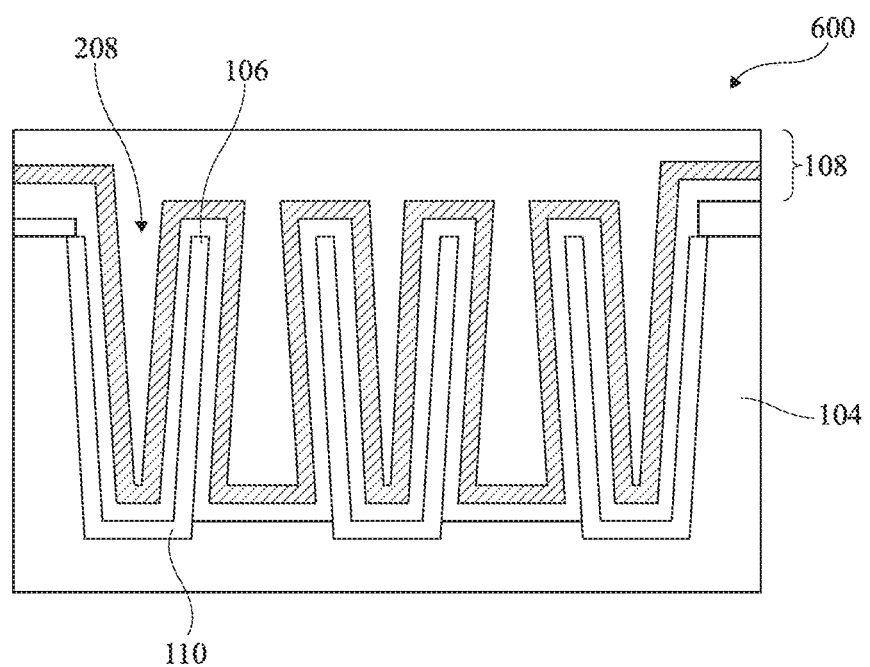
FIG. 6 schematically and partially shows another example of a capacitor obtained by the implementation of the methods of FIGS. 3A, 3B, 4A, 4B and 5.

FIG. 6 schematically and partially shows another example of a capacitor obtained by the implementation of the methods of FIGS. 3 to 5.

In this embodiment, the sides of each wall 106 are inclined with respect to the vertical direction, by an angle smaller than 45°, for example, so that the distance between the sides close to portion 110 is smaller than the distance between the upper surfaces of the sides of the wall.

The inclined shape of the walls may for example be obtained incidentally during the manufacturing method. More particularly, such a shape may be the result of the step of etching cavities 208 where the walls of the obtained cavity 208 are not straight.

In a structure where the cavities are separated by substrate regions, such an inclined wall shape would cause a decrease in surface area A of the capacitor and thus a decrease in the capacitance as compared with the capacitance which would have been obtained if the walls were not inclined.

In the embodiment of FIG. 6, the surface area decrease caused by the shape of cavities 208 is substantially compensated for by the regions between cavities 208. Such regions have a shape complementary to the shape of cavities 208. Thus the decrease in surface area A in cavities 208 is substantially compensated for by the increase of surface area A between cavities 208.

Various embodiments and variations have been described. It should be clear to those skilled in the art that certain characteristics of these various embodiments and variations may be combined, and other variations will occur to those skilled in the art.

Finally, the practical implementation of the described embodiments and variations is within the abilities of those skilled in the art based on the functional indications given hereabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical capacitor, comprising:
  a substrate defining a cavity, the substrate made of a first material;
  a plurality of insulating layers spaced apart from each other within the cavity of the substrate, the plurality of insulating layers made of a second material different from the first material, each of the insulating layers having a first inclined wall, a second inclined wall, and a bottom surface between the first and second inclined walls, the bottom surface of the insulating layer on a first portion of a surface of the substrate in the cavity;
  a stack of layers conformally covering the plurality of insulating layers and a first surface and a second surface opposite the first surface of each of the first and second inclined walls of the plurality of insulating layers and conformally covering a second portion of the surface of the substrate in the cavity, the stack of layers including at least one insulating layer and two conductive layers,
  wherein a first lateral distance between two adjacent insulating layers at the surface of the substrate in the cavity is greater than a second lateral distance between the two adjacent insulating layers at upper surfaces of the two adjacent insulating layers opposite the surface of the substrate in the cavity.

2. The capacitor of claim 1, wherein the stack of layers further extends over and covers the substrate between the walls.

3. The capacitor of claim 1, wherein the first material is silicon oxide.

4. The capacitor of claim 1, wherein the stack of layers comprises an alternation of insulating layers and of conductive layers, a lower layer and an upper layer of the stack of layers being conductive layers.

5. The capacitor of claim 1, wherein each wall forms, in top view, the contour of a geometric shape.

6. The capacitor of claim 5, wherein the stack of layers extends inside and outside of the contours of the geometric shapes.

7. The capacitor of claim 5, wherein the substrate within the contour is covered with a layer made of the first material.

8. The capacitor of claim 1, wherein the stack of layers extends over two opposite sides of at least a portion of the walls.

9. The capacitor of claim 1, wherein a smallest dimension of each wall is smaller than 150 nm.

10. The capacitor of claim 1, wherein the second material is a material capable of being oxidized.

11. A method of manufacturing a capacitor comprising:
forming a cavity within a substrate;
forming a plurality of insulating layers spaced apart from each other within the cavity of the substrate, each of the plurality of insulating layers having a first inclined wall, a second inclined wall, and a bottom surface between the first and second inclined walls, the bottom surface of the insulating layer on a portion of a surface of the substrate in the cavity;
forming a stack of layers extending over the plurality of insulating layers and a first surface and a second surface opposite the first surface of the first and second inclined walls of the plurality of insulating layers; and
forming the stack of layers on a second portion of the surface of the substrate in the cavity,
wherein the first and second inclined walls are a first material and the substrate is a second material, the first and second materials being different,
wherein a distance between two adjacent inclined walls gradually decreases as the inclined walls extend further away from the substrate.

12. The method of claim 11, comprising forming cavities in the substrate.

13. The method of claim 12, further comprising forming an insulating layer on sidewalls and bottoms of each of the cavities.

14. The method of claim 13, wherein forming the insulating layer comprises oxidation of the substrate.

15. The method of claim 12, further comprising etching portions of the substrate located between the cavities.

16. The method of claim 12, wherein the first and second inclined walls are inclined with respect to a vertical direction extending orthogonal to a surface of the substrate.

17. A method, comprising:
forming an insulating layer on a surface of a substrate;
removing portions of the insulating layer to leave remaining portions of the insulating layer on the surface of the substrate, regions of the substrate in which cavities are to be formed being defined between adjacent remaining portions of the insulating layer;
forming a selective layer on the remaining portions of the insulating layer, the selective layer being a material capable of being selectively etched and that cannot be oxidized;
forming the selective layer on portions of the surface of the substrate in the regions where cavities are to be formed, openings being defined between the selective layer on the portions of the surface of the substrate where cavities are to be formed;
forming a second insulating layer over the selective layer;
forming cavities in the substrate at the openings of the portions of the surface of the substrate where the cavities are to be formed;
removing the second insulating layer and selective layer between the cavities;
removing portions of the substrate between the cavities; and
conformally forming a stack of layers over walls of the cavities and walls of the removed portions of the substrate between the cavities.

18. The method of claim 17, wherein the stack of layers comprises a single insulating layer between two conductive layers.

19. The method of claim 17, wherein the selective layer is silicon nitride.

20. The method of claim 17, further comprising oxidizing surfaces of the cavities to form an insulation layer in each of the cavities.

* * * * *